United States Patent [19]

Pascucci

[11] Patent Number: 5,936,907
[45] Date of Patent: Aug. 10, 1999

[54] METHOD FOR DETECTING REDUNDED DEFECTIVE ADDRESSES IN A MEMORY DEVICE WITH REDUNDANCY

[75] Inventor: Luigi Pascucci, Sesto San Giovanni, Italy

[73] Assignee: SGS-Thomson Microelectronics S.r.l., Agrate Brianza, Italy

[21] Appl. No.: 09/183,469

[22] Filed: Oct. 30, 1998

Related U.S. Application Data

[63] Continuation of application No. 08/841,904, Apr. 17, 1997, Pat. No. 5,838,623.

[30] Foreign Application Priority Data

Apr. 18, 1996 [IT] Italy ....................................... 96830216

[51] Int. Cl.$^6$ ................................................... G11C 13/06
[52] U.S. Cl. ........................... 365/222; 365/200; 365/210
[58] Field of Search .................................... 365/200, 210, 365/222

[56] References Cited

U.S. PATENT DOCUMENTS 5,838,623  11/1998  Pascucci .................................. 365/222

*Primary Examiner*—Terrell W. Fears
*Attorney, Agent, or Firm*—Wolf, Greenfield & Sacks, P.C.

[57] ABSTRACT

A method for detecting redunded defective addresses in a memory device with redundancy including at least one memory register for storing at least one defective address. The memory register includes a plurality of memory units each one storing a defective address bit and comparing the defective address bit with a respective current address bit supplied to the memory device; the memory register activates a respective redundancy selection signal when the current address coincides with the defective address stored therein. The method provides for: activating a forcing signal for forcing the activation of the redundancy selection signal to be independent of the coincidence of a first group of current address bits, associated to a respective first group of the memory units, with the defective address bits stored in the respective first group of memory units; scanning all the possible configurations of a second group of current address bits associated with a second group of the memory units and sequentially supplying the memory device with all the configurations; detecting a configuration of the second group of current address bits for which the redundancy selection signal is activated; while supplying the memory device with the configuration of the second group of current address bits, deactivating the forcing signal and sequentially supplying the memory device with a scanning of all the possible configurations of the first group of address bits; detecting a configuration of the first group of current address bits for which the redundancy selection signal is activated.

22 Claims, 4 Drawing Sheets

METHOD FOR DETECTING REDUNDED DEFECTIVE ADDRESSES IN A MEMORY DEVICE WITH REDUNDANCY

CROSS REFERENCE TO RELATED APPLICATIONS

This application is a continuation of application Ser. No. 08/841,904, filed Apr. 17, 1997, now U.S. Pat. No. 5,838,623, entitled METHOD FOR DETECTING REDUNDED DEFECTIVE ADDRESSES IN A MEMORY DEVICE WITH REDUNDANCY, which prior application is incorporated herein by reference.

BACKGROUND OF THE INVENTION

1. Field of the Invention

The present invention relates to a method for detecting redunded defective addresses in a memory device with redundancy.

2. Discussion of the Related Art

In the field of semiconductor memories, it is a common technique to provide redundancy memory elements, such as redundancy word lines and/or bit lines, useful for functionally replacing defective word lines or bit lines. To this purpose, non-volatile memory registers (redundancy registers) must be provided in the memory device for storing the addresses of the defective memory elements (defective addresses), and for comparing a current address supplied to the memory device with the defective addresses stored therein: when the current address coincides with a defective address, the defective memory element is not selected, and a redundancy memory element is instead selected; if this occurs, it is said that the defective memory element has been redunded.

The functional substitution of a redundancy memory element for a defective memory element is completely transparent to the end user, but the memory device manufacturer could be interested in knowing which of the memory elements are defective, i.e. which are the defective addresses.

Conventionally, for implementing this particular test mode, output signals of the redundancy registers (i.e. the signals representative of the condition of coincidence between the current address supplied to the memory device and one of the defective addresses stored therein) are logically OR-ed together and the resulting signal is directly supplied to an output terminal of the memory device; the memory device is sequentially supplied with all the possible address configurations: when the current address configuration coincides with a defective address, a transition is detected at the output terminal, indicating that the current address is a defective address.

This methodology is time consuming, especially for memories of large size: for example, in a byte-wide 16 Mbit device $2^{21}$ different address configurations must be sequentially scanned.

In view of the state of art described, it is an object of the present invention to provide an improved method for detecting redunded defective addresses in a memory device with redundancy which is faster than the conventional method.

SUMMARY OF THE INVENTION

According to the present invention, this and other objects are achieved by a method for detecting redunded defective addresses in a memory device with redundancy comprising at least one memory register for storing at least one defective address, said memory register comprising a plurality of memory units each one storing a defective address bit and comparing said defective address bit with a respective current address bit of a current address supplied to the memory device, the memory register activating a respective redundancy selection signal when the current address coincides with the at least one defective address stored therein, comprising the steps of:

activating a forcing signal for forcing the activation of said redundancy selection signal to be independent of the coincidence of a first group of current address bits, associated with a respective first group of said memory units, with the defective address bits stored in said respective first group of memory units;

scanning all the possible configurations of a second group of current address bits associated with a second group of said memory units and sequentially supplying the memory device with all said configurations;

detecting a configuration of said second group of current address bits for which said redundancy selection signal is activated;

while supplying the memory device with said configuration of the second group of current address bits, deactivating said forcing signal and sequentially supplying the memory device with a scanning of all the possible configurations of said first group of address bits;

detecting a configuration of said first group of current address bits for which said redundancy selection signal is activated.

The present invention provides a faster method to detect redunded defective addresses, because instead of scanning all the possible address configurations it provides for scanning a first subset of address bits, detecting which configurations of the subset of address bits are defective and, only for those configurations, scanning the remaining subset of address bits. The number of configurations to be scanned is thus substantially smaller than the overall number of address configurations of the memory device, thus allowing a significant time saving.

BRIEF DESCRIPTION OF THE DRAWINGS

These and other features and advantages of the present invention will be made more evident by the following detailed description of two particular embodiments, described as non-limiting examples in the annexed drawings, wherein.

DETAILED DESCRIPTION

Figure 1:
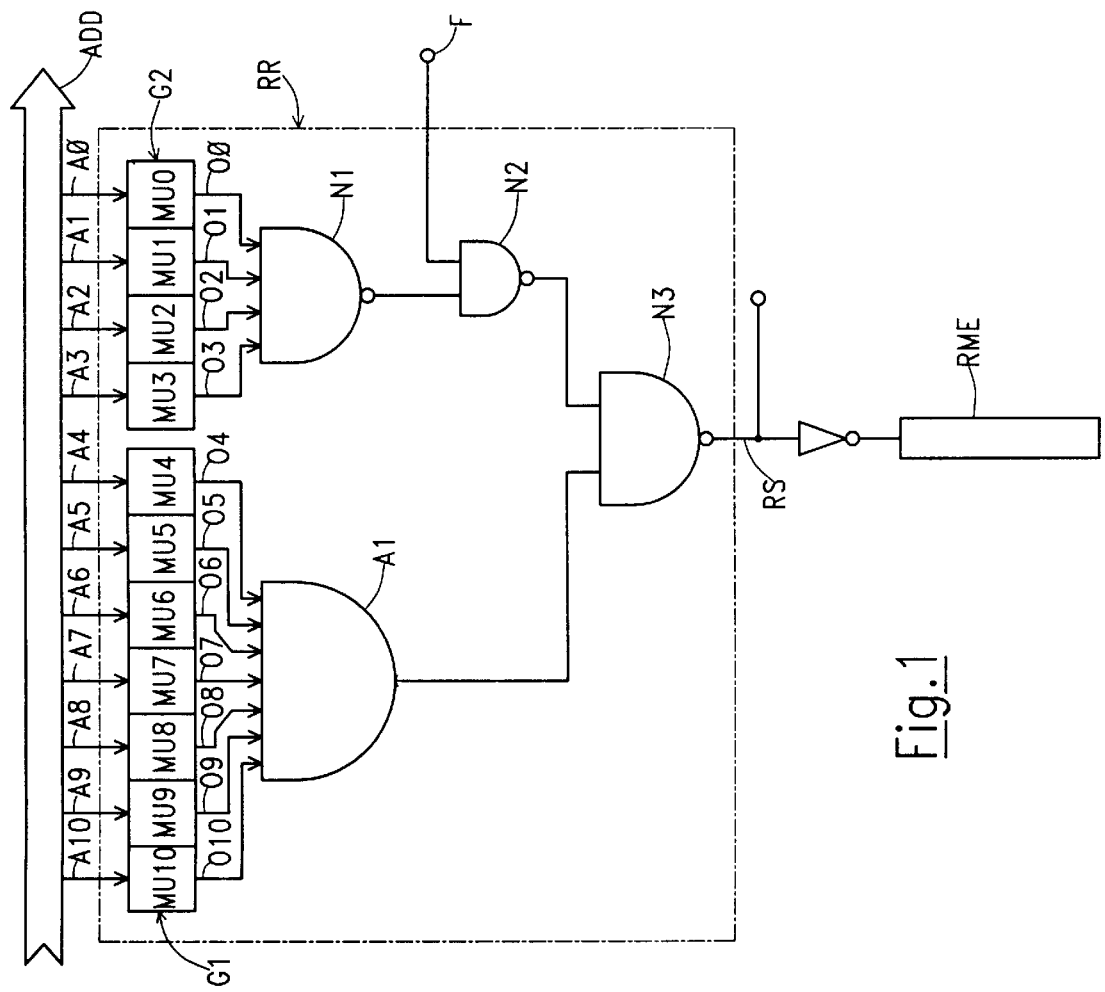
FIG. 1 schematically shows a first embodiment of a redundancy register suitable to implement the method of the present invention.

FIG. 1 schematically shows a programmable memory register (redundancy register) provided in a memory device to implement redundancy.

Figure 2:
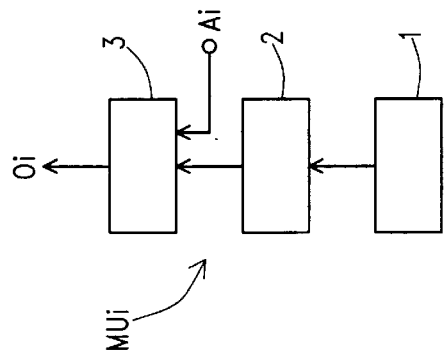
FIG. 2 schematically shows a programmable memory unit of the redundancy register.

The redundancy register RR comprises a plurality of programmable memory units MU0–MU10, each one capable of storing a binary information unit. Each one of the memory units MU0–MU10 is supplied by a respective address signal A0–A10 taken from an address signal bus ADD of the memory device. As known, memory devices comprise a matrix of memory cells arranged in row (word lines) and columns (bit lines); A0–A10 can be for example the row address signals which are decoded for selecting one of the word lines of the memory matrix; in alternative, A0–A10 can be the column address signals which are decoded for selecting one of the bit lines of the memory matrix. As shown schematically in FIG. 2, each one of the memory units MU0–MU10 comprises in a per-se known way a programmable memory element 1, such as for example a fuse or a floating-gate MOS transistor, a sensing circuit 2 for reading the datum stored in the programmable memory element, and a digital comparator 3 for comparing the datum stored in the programmable memory element with the current address signal Ai (i=0 . . . 10). Each memory unit MUi generates a respective output signal Oi which is activated (at the high logic level) when the respective current address signal Ai coincides with the datum stored in the respective memory element.

The memory units MU0–MU10 are grouped in two groups: a first group G1 comprises for example the seven memory units MU4–MU10, associated with the seven most-significant address bits A4–A10; a second group G2 comprises the remaining four memory units MU0–MU3 associated with the four least-significant address bits A0–A3. Other divisions of the plurality of memory units MU0–MU10 among the two groups G1 and G2 are also possible.

The output signals O0–O3 of the second group G2 of memory units MU0–MU3 supply a first NAND gate N1; the output signals O4–O10 of the first group G1 of memory units MU4–MU10 supply an AND gate A1. An output signal of NAND gate N1 supplies a first input of a second NAND gate N2; a second input of NAND gate N2 is supplied by a forcing signal F, which is normally kept at the low logic level and is activated in a particular test mode, as will be explained in greater detail in the following.

An output signal of AND gate A1 and an output signal of NAND gate N2 supply a third NAND gate N3. An output signal RS of NAND gate N3 is activated (at the low logic level) only when the current address signals A0–A10 coincides with the address stored in the memory units MU0–MU10. Signal RS allows the selection of a respective redundancy memory element RME (for example a redundancy word line or a redundancy bit line). In the practice, AND gate A1 and NAND gate N1 can be practically implemented by any combination of simpler logic gates suitable to optimize chip area and speed.

Figure 3:
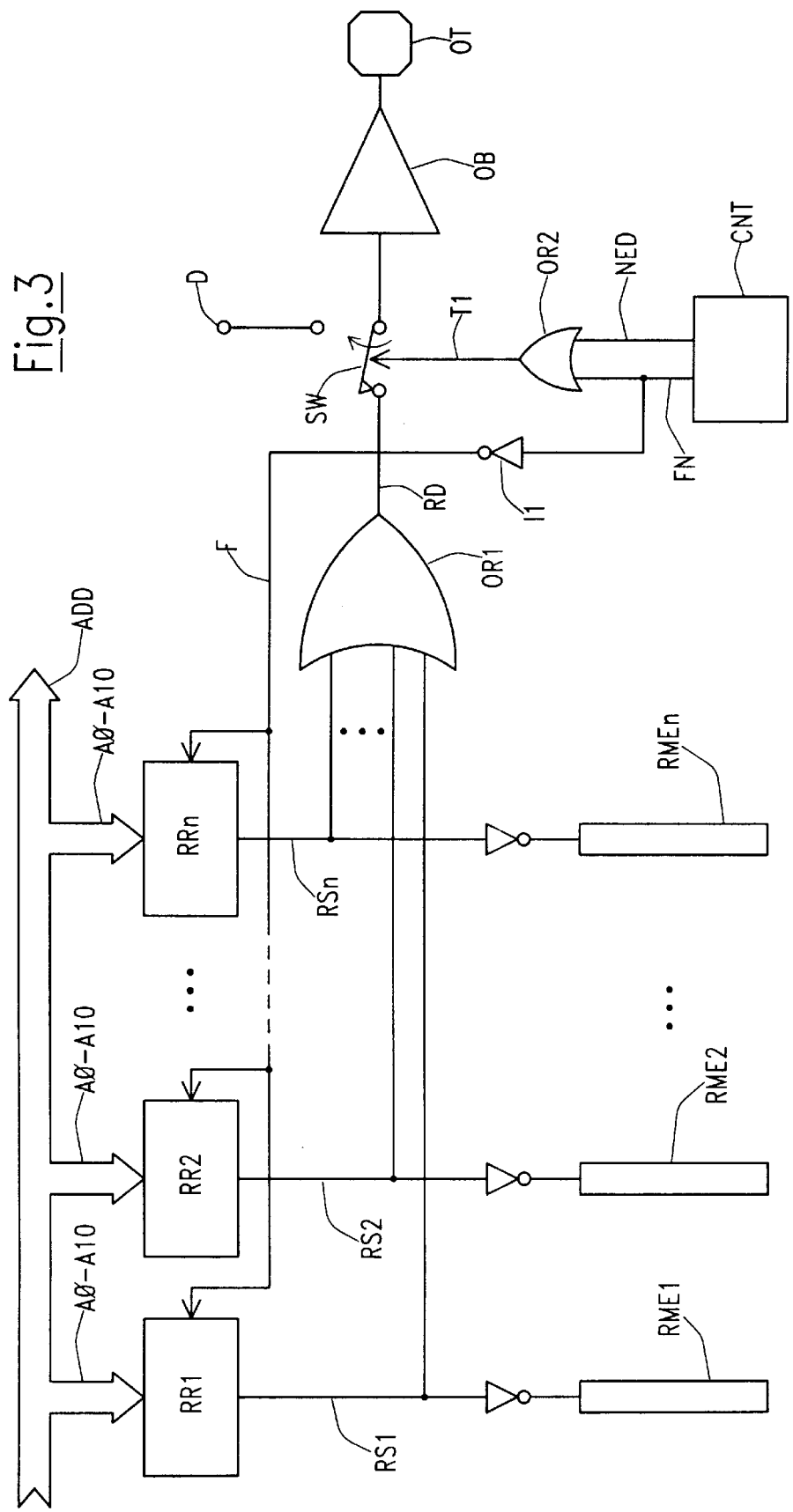
FIG. 3 schematically shows a circuit arrangement for actuating the method of the present invention.
Figure 4:
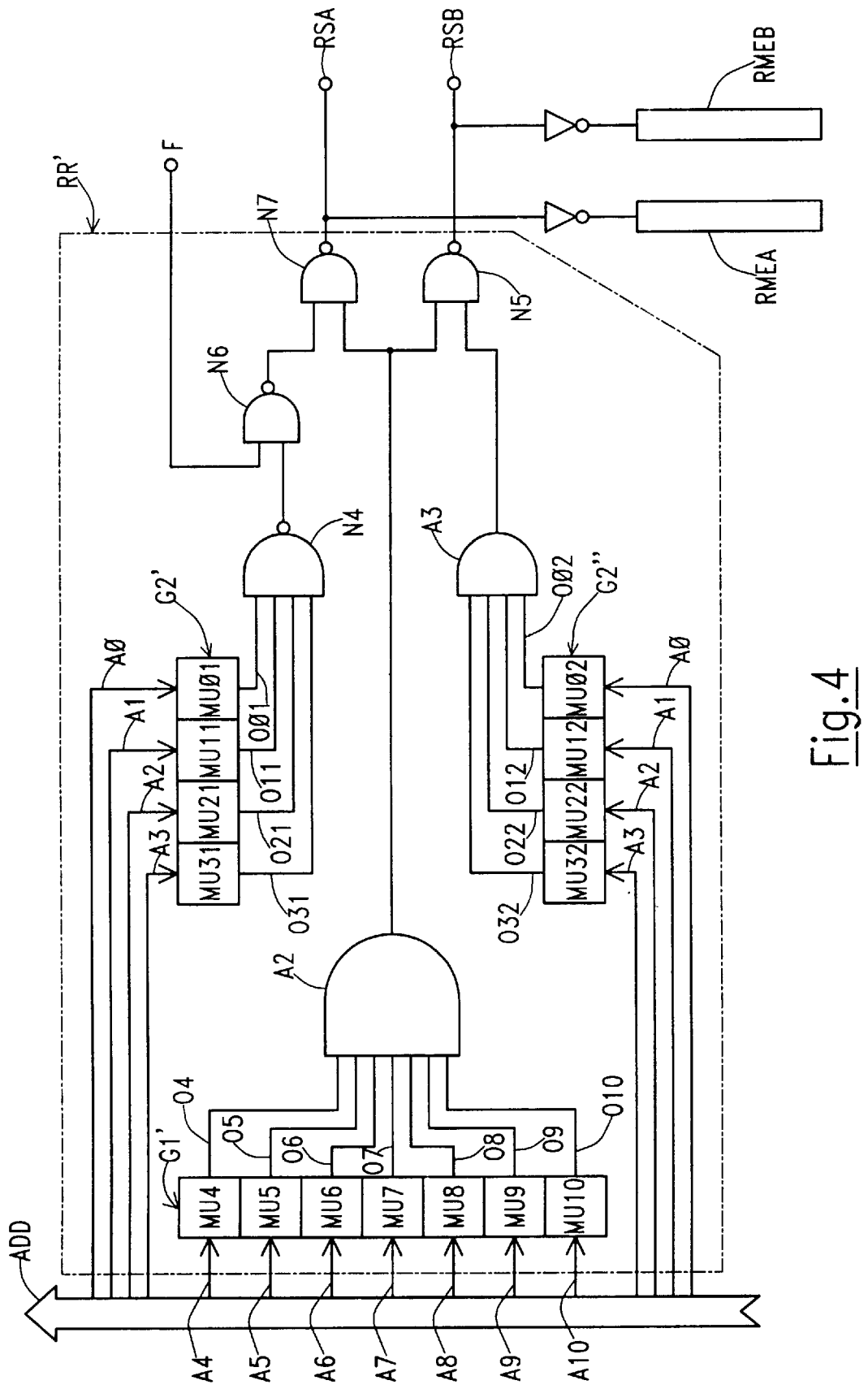
FIG. 4 schematically shows a second embodiment of a redundancy register suitable to implement the method of the present invention.

As shown in FIG. 3, a plurality of redundancy memory elements RME1–RMEn is normally provided in a memory device (again, redundancy memory elements RME1–RMEn can be either redundancy word lines or redundancy bit lines). For each redundancy memory element, a respective redundancy register RR1–RRn having the structure shown in FIG. 1 must be provided; each one of the redundancy registers RR1–RRn generates a respective redundancy element selection signal RS1–RSn which is activated when the current address signals A0–A10 coincide with the address stored in the respective memory units MU0–MU10.

For testing purposes, the redundancy selection signals RS1–RSn are supplied to a first OR gate OR1. An output signal RD of OR gate OR1 is coupled to an output buffer OB through a switch SW controlled by a test signal T1. Switch SW allows to switch the input of output buffer OB between signal RD and a data signal D carrying a datum obtained through the conventional read path of the memory device. Signal T1 is generated by a second OR gate OR2 which receives at its inputs two test signals NED and FN, generated by a control logic CNT which is normally provided in the memory device; signal FN is the logic complement of signal F, the latter being generated by an inverter I1. Output buffer OB drives an output terminal OT (output pad) of the memory device.

The circuit described above operates in the following way.

When the memory device is operated in the conventional read mode, the current address supplied to the memory device is compared, by the redundancy registers RR1–RRn, with the defective addresses stored therein.

If the current address is not a defective address (i.e., an address of a defective word line or bit line of the memory matrix) the signals RS1–RSn are not activated, and no redundancy memory element is selected. In normal read mode, test signals FN and NED are both deactivated, so that switch SW connects the input of output buffer OB to the data signal D, which carries the result of the sensing operation of an addressed memory cell of the memory matrix.

If the current address is a defective address, the redundancy register RR1–RRn wherein such defective address is stored activates the respective redundancy selection signal RS1–RSn (referring to FIG. 1, all the signals O0–O10 are activated). The activation of one redundancy selection signal RS1–RSn inhibits the selection of the defective word line or bit line, and enables the selection of the associated redundancy memory element RME1–RMEn. Also in this case, test signals FN and NED are deactivated, and switch SW connects the input of output buffer OB with the data signal D.

In a first test mode, control logic CNT activates signal NED: in this way, switch SW connects the input of output buffer OB to the output RD of OR gate OR1. In this way, if the memory device is sequentially supplied with all the possible configurations of address signals A0–A10 (which in this example are $2^{11}$), each time the memory device is supplied with an address configuration corresponding to one of the defective addresses stored in the redundancy registers RR1–RRn, one of the redundancy selection signals RS1–RS2 will be activated, and the signal RD will also be activated. A logic-level transition will be detected at the output terminal OT of the memory device: it is thus possible to determine which address configurations correspond to defective addresses.

This is the conventional technique used in the prior art for detecting the defective addresses. It is easy to realize that such a technique requires a significant time to be completed, because the number of different address configurations is high: in the shown example, $2^{11}$ different address configurations must be scanned to detect the addresses of, for example, the defective word lines of the memory matrix; if, as usual, both redundancy word lines and redundancy bit lines are provided, a similar operation is to be performed for detecting the addresses of defective bit lines: this means that in the case of, for example, a byte-wide 16 Mbits memory, $2^{21}$ different address configurations must be scanned.

According to the present invention, a faster technique is made available in addition to the conventional one. This new test mode is activated by activating the signal FN which, as visible in FIG. 1, forces the output of NAND N2 to a logic "1" independently of the output of NAND N1, i.e. independently of the value of signals O0–O3. In this way, only the 27 different configurations of the seven most significant address bits A4–A10 are initially scanned: when the current configuration of address signals A4–A10 coincides with the part of a defective address stored in the first group G1 of memory units MU4–MU10 of one of the redundancy registers RR1–RRn, the respective redundancy selection signal RS1–RSn is activated, signal RD is activated and a level transition can be detected at the output terminal OT of the memory device; when such a transition is detected, the current configuration of address signals A4–A10 is maintained, and the control logic deactivates signal FN and activates signal NED to enter the conventional test mode; address signals A0–A3 (24 different combinations) are then scanned to find the complete address signal configuration corresponding to a defective word line or bit line of the memory matrix.

It can be appreciated that by means of the new testing technique according to the present invention, a maximum of $2^7+n*2^4$ different address configurations have to be scanned to detect the defective addresses, where n is the number of redundancy memory elements RME1–RMEn. For example, if n=8, the number of different address configurations which must be scanned is 256, while with the conventional technique such number is $2^{11}$=2048. More generally, if m is the number of address bits, h is the number of address bits stored in the first group G1 of memory units, K is the number of address bits stored in the second group G2 of memory units, and n is the number of redundancy memory elements, the number of different address configurations to be scanned is $2^h+n*2^k$; for n small, this number is much less than $2^m$.

It should be understood that if both redundancy word lines and redundancy bit lines are provided in the memory device, the previously described procedure must be performed for both the row address signals and the column address signals.

Figure 5:
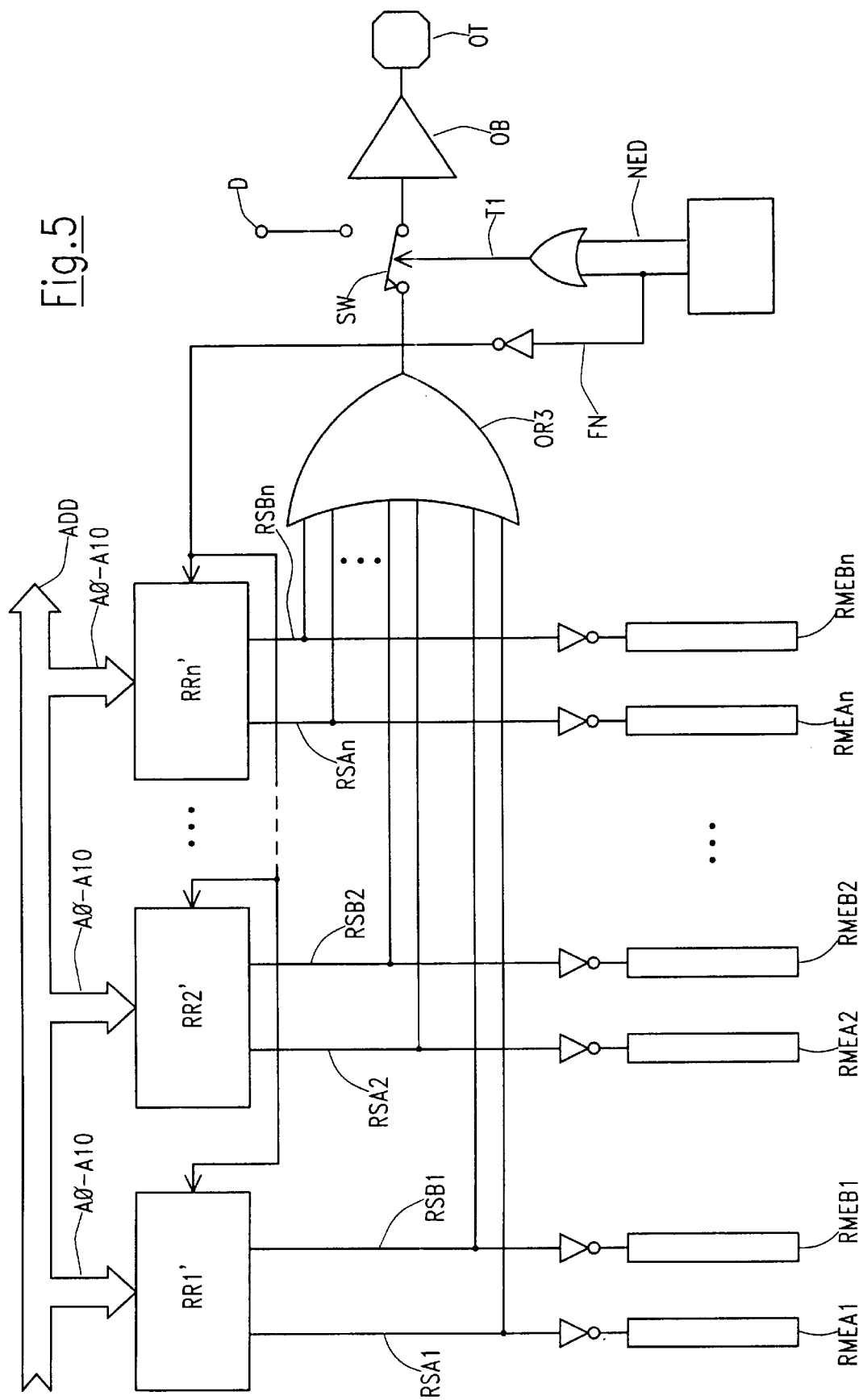
FIG. 5 shows a circuit arrangement similar to that FIG. 3, to be used with the redundancy registers according to the second embodiment.

FIG. 5 schematically shows another embodiment of a redundancy register RR'. Differently from the embodiment of FIG. 1, which allows to store a single defective address, this second embodiment is capable of storing two defective addresses having at least a common part; for this reason the redundancy register RR' will be called "dual redundancy register". The redundancy register RR' comprises a first group G1' of programmable memory units MU4–MU10, associated to the address signals A4–A10, a second group G2' of programmable memory units MU01–MU31 associated to the address signals A0–A3, and a third group G2" of programmable memory units MU02–MU32 also associated to the address signals A0–A3. The first group G1' of memory units stores the common part of two defective addresses; the second group G2' of memory units MU01–MU31 stores the remaining part of one of the two defective addresses; the third group G2" of memory units MU02–MU32 stores the remaining part of the other of the two defective addresses. This structure of the redundancy register is particularly suitable in some kinds of memory devices, wherein there is a high probability that when a defective matrix word line or bit line exists, also the adjacent word line or bit line is defective: since adjacent word lines or bit lines generally have part of their addresses in common, it is advantageous to use a dual redundancy register instead of using two redundancy registers of the type shown in FIG. 1.

Output signals O4–O10 of the first group G1' of memory units supply a first AND gate A2. Output signals O01–O31 of the second group G2' of memory units supply a first NAND gate N4. Output signals O02–O32 of the third group G2" of memory units supply a second AND gate A3. An output signal of AND gate A2 and an output signal of AND gate A3 supply a second NAND gate N5. An output signal of NAND gate N4 supplies a first input of a third NAND gate N6 whose second input is supplied by the forcing signal F. An output signal of NAND gate N6 supplies a first input of a fourth NAND gate N7 whose second input is supplied by the output signal of AND gate A2. An output signal RSA of NAND gate N7 allows the selection of a first redundancy memory element RMEA associated to the redundancy register RR'; an output signal RSB of NAND gate N5 allows the selection of a second redundancy memory element RMEB associated to the redundancy register RR'.

FIG. 5 is similar to FIG. 3: a plurality of dual redundancy registers RR1'–RRn' is shown, each one associated to two respective redundancy memory elements RMEA1–RMEAn and RMEB1–RMEBn.

As in the case of FIG. 3, the redundancy selections signals RSA1–RSAn and RSB1–RSBn generated by the dual redundancy registers RR1'–RRn' supply an OR gate OR3; an output of OR gate OR3 can be selectively connected to an output buffer OB by means of a switch SW, controlled by a test signal T1; signal T1 is again the logic OR of signals FN and NED, generated by the control logic CNT.

As in the previous embodiment, two testing techniques are possible to detect the addresses corresponding to defective word lines or bit lines: a first technique is conventional and provides for sequentially scanning all the possible configurations of address signals A0–A10; this test mode is entered by activating the signal NED. A second technique is new and faster than the conventional one: it provides for forcing the output of NAND gate N6 in each redundancy register to a predetermined logic level equal to the logic level it would assume if the configuration of address signals A0–A3 were equal to the address configuration stored in the memory units MU01–MU31 of the second group G2'; then, only the address signals A4–A10 are scanned, so that when the configuration of signals A4–A10 coincides with the one stored in the first group G1' of memory units MU4–MU10 of one of the redundancy registers RR1'–RRn', the respective redundancy selection signal RSA1–RSAn is activated, and a logic level transition takes place at the output terminal OT: when such a transition is detected, the current configuration of address signals A4–A10 is maintained, the signal FN is deactivated and the signal NED is activated; then the remaining address signals A0–A3 are scanned: when the configuration of signals A0–A3 corresponds to the defective address part stored in the second group G2' or the third group G2" of memory units of the redundancy register, a transition will be detected at the output terminal OT of the memory device, indicating that the current address corresponds to a defective memory element (word line or bit line).

It should be observed that after having detected that the current configuration of address signals A4–A10 corresponds to the most significant part of a defective address, it is immediately possible to determine if the dual redundancy register RR1'–RRn' wherein said part of defective address is stored is completely utilized or if only one defective address is stored therein: to this purpose, and provided that it is assumed that defective addresses having A0= . . . =A3=1 are not redunded, it is sufficient to deactivate signal FN and activate signal NED, and to supply the memory device with a configuration of address signals A0–A3 corresponding to the unprogrammed (virgin) state of the memory units: if a level transition is detected at the output terminal OT, then it means that only one defective address is stored in the redundancy register, and there is the possibility to redund another defective address having a configuration of signals A4–A10 identical to that of the already stored defective address.

The present invention is not limited to the particular embodiments previously described; in particular, the number of memory units of the groups G1 and G2 or G1', G2' and G2" could be varied (obviously, the higher the number of memory units of group G1 or G1', the lower the number of memory units of group G2 or groups G2' and G2").

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of identifying a defective memory address in a memory device, the method comprising the steps of:
    a) applying an address signal including n address bits to the memory device;
    b) comparing a first subset h of address bits of the applied address signal to a respective first subset h' of address bits of a stored defective memory address also including n bits;
    c) when the first subset h of applied address bits coincides with the first subset h' of stored address bits:
    d) maintaining a configuration of the first subset h of applied address bits the same as that of step c);
    e) comparing a second subset k of applied address bits to a respective second subset k' of stored address bits;
    f) when the second subset k of applied address bits coincides with the second subset k' of stored address bits, identifying a defective memory address as the applied address which is the result of concatenating the first subset h with the second subset k of applied address bits; and
    g) repeating steps e) and f) for all configurations of the second subset h of applied address bits; and
    h) repeating steps a)–c) for all configurations of the first subset h of applied address bits.

2. The method as recited in claim 1, wherein step g) comprises a step of applying all configurations of the second subset k of applied address bits in a sequential order.

3. The method as recited in claim 1, wherein step h) comprises a step of applying all configurations of the first subset h of applied address bits in a sequential order.

4. The method as recited in claim 1, wherein
    step b) comprises a step of disabling a comparison of the second subset k' of applied address bits to the second subset k of stored address bits; and
    step e) comprises a step of enabling the comparison of the second subset k' of applied address bits to the second subset k' of stored address bits.

5. The method as recited in claim 1, further comprising steps of:
    storing the defective memory address in a redundancy memory register, the memory register comprising a plurality of memory units each storing a defective address bit of the n defective address bits, wherein steps b) and e) each comprises each memory unit comparing a respective bit of the applied address signal to the bit stored therein and outputting a signal at a first logic level when they coincide.

6. The method as recited in claim 5, wherein,
    step c) comprises each memory unit storing bits of the first subset h of the stored address bits and outputting a signal at the first logic level when the first subset h of applied address bits coincides with the first subset h of stored address bits.

7. The method as recited in claim 1, wherein:
    the first subset h of address bits consists of the h most significant bits of the n address bits; and
    the second subset k of address bits consists of the k least significant bits of the n address bits,
    wherein h+k=n.

8. The method as recited in claim 7, wherein
    n=11;
    h=7; and
    k=4.

9. A system for identifying a defective memory address in a memory device, the system comprising:
    means for receiving an address signal of n bits applied to the memory device;
    first means for comparing a first subset h of applied address bits to a respective first subset h' of address bits of a first stored defective memory address also of n bits and for outputting a first signal indicating coincidence of the first subset h with the first subset h';
    second means for comparing a second subset k of applied address bits to a respective second subset k' of the first stored defective memory address and for outputting a second signal at a first logic level indicating coincidence of the second subset k with the second subset k';
    means for forcing the second signal of the second comparing means to the first logic level when a test signal is asserted; and
    means for receiving the first signal and, when the first signal is indicating coincidence of the first subset h and the first subset h', deasserting the test signal, maintaining a configuration of the first subset h of applied address bits and identifying at least one second subset k of applied address bits which coincides with the second subset k' of stored address bits.

10. The system as recited in claim 9, further comprising:
    means for providing the test signal to the forcing means.

11. The system as recited in claim 9 wherein:
    the first comparing means comprises means for comparing the h most significant bits of the applied address signal to the respective h most significant bits of the stored defective memory address; and
    the second comparing means comprises means for comprising the k least significant bits of the applied address signal to the respective k least significant bits of the stored defective memory address,
    wherein h+k=n.

12. The system as recited in claim 9, wherein:
    the second comparing means comprises means for comparing a second stored defective memory address to the applied memory address,
    wherein a first configuration of the h most significant bits of the first stored defective memory address and the h most significant bits of the second stored defective memory address are coincident.

13. A system for identifying a defective memory address in a memory device, the system comprising:
    a first circuit to compare a first subset h of address bits of an n-bit address signal applied to the memory device to a respective subset h' of address bits of a first stored defective memory address and to output a first coincidence signal when subset h and subset h' coincide;

a second circuit to compare a second subset k of address bits of the applied address signal to a respective second subset k' of address bits of the first stored defective memory address and to output a second coincidence signal different from the first coincidence signal, at a first logic level when subset k and subset k' coincide;

a third circuit to force the second coincidence signal to the first logic level as a function of a test signal;

a fourth circuit to receive the first and second coincidence signals and output a selection signal when the first and second coincidence signals are each asserted; and a fifth circuit to assert the test signal and thereby assert the second coincidence signal at the first logic level and, when the selection signal is asserted, to deassert the test signal and to indicate when the first and second coincidence signals are asserted at the first logic level, thereby indicating coincidence of the subset h with the subset h' and coincidence of the subset k with the subset k' whereby the defective memory address is the applied memory address comprising the subset h and the subset k.

14. The system as recited in claim 13, wherein:

the first subset h of address bits consists of the h most significant bits of the n address bits; and the second subset k of address bits consists of in the k least significant bits of the n address bits, wherein h+k=n.

15. The system as recited in claim 13, further comprising:

a sixth circuit to compare a second stored defective memory address to the applied memory address and to output a third coincidence signal when the second subset k coincides with the k least significant bits of the second stored defective memory address, wherein a configuration of the h most significant bits of the first and second stored defective memory addresses are coincident.

16. A method of identifying a target address having n address bits of which there are h most significant bits and k least significant bits, the method comprising:

a) generating a first address having n address bits of which there are h most significant bits and k least significant bits;

b) comparing the h most significant bits of the first address to the h most significant bits of the target address;

c) when the h most significant bits of the target address and the first address are the same, comparing the k least significant bits of the target address to the k least significant bits of the first address;

d) when the k least significant bits of the target address coincide with the k least significant bits of the first address, determining the target address to be equal to the first address;

e) repeating steps c and d for all configurations of the k least significant bits of the first address; and f) repeating steps a–c for all configurations of the h most significant bits of the first address.

17. The method as recited in claim 16, wherein the target address is stored in a memory register.

18. The method as recited in claim 16, wherein the k least significant bits are applied in a sequential order.

19. The method as recited in claim 16, wherein the h most significant bits are applied in a sequential order.

20. A memory device including a memory address identifying circuit to identify a defective memory address in the memory device, the address identifying circuit comprising:

a first circuit to compare a first subset h of address bits of an n-bit address signal applied to the memory device to a respective subset h' of address bits of a first stored defective memory address and to output a first coincidence signal when subset h and subset h' coincide;

a second circuit to compare a second subset k of address bits of the applied address signal to a respective second subset k' of address bits of the first stored defective memory address and to output a second coincidence signal different from the first coincidence signal, at a first logic level when subset k and subset k' coincide;

a third circuit to force the second coincidence signal to the first logic level as a function of a test signal;

a fourth circuit to receive the first and second coincidence signals and output a selection signal when the first and second coincidence signals are each asserted; and a fifth circuit to assert the test signal and thereby assert the second coincidence signal at the first logic level and, when the selection signal is asserted, to deassert the test signal and to indicate when the first and second coincidence signals are asserted at the first logic level, thereby indicating coincidence of the subset h with the subset h' and coincidence of the subset k with the subset k' whereby the defective memory address is the applied memory address comprising the subset h and the subset k.

21. The memory device as recited in claim 20, wherein:

the first subset h of address bits consists of the h most significant bits of the n address bits; and the second subset k of address bits consists of in the k least significant bits of the n address bits, wherein h+k=n.

22. The memory device as recited in claim 20, further comprising:

a sixth circuit to compare a second stored defective memory address to the applied memory address and to output a third coincidence signal when the second subset k coincides with the k least significant bits of the second stored defective memory address, wherein a configuration of the h most significant bits of the first and second stored defective memory addresses are coincident.

* * * * *